United States Patent
Cheng et al.

(10) Patent No.: US 10,217,818 B2
(45) Date of Patent: Feb. 26, 2019

(54) METHOD OF FORMATION OF GERMANIUM NANOWIRES ON BULK SUBSTRATES

(71) Applicant: International Business Machines Corporation, Armonk, NY (US)

(72) Inventors: Kangguo Cheng, Schenectady, NY (US); Pouya Hashemi, White Plains, NY (US); Ali Khakifirooz, Los Altos, CA (US); Alexander Reznicek, Troy, NY (US)

(73) Assignee: International Business Machines Corporation, Armonk, NY (US)

(*) Notice: Subject to any disclaimer, the term of this patent is extended or adjusted under 35 U.S.C. 154(b) by 23 days.

(21) Appl. No.: 15/152,249

(22) Filed: May 11, 2016

(65) Prior Publication Data

US 2016/0254350 A1 Sep. 1, 2016

Related U.S. Application Data

(62) Division of application No. 14/478,730, filed on Sep. 5, 2014, now Pat. No. 9,343,529.

(51) Int. Cl.
*H01L 27/12* (2006.01)
*H01L 29/06* (2006.01)
(Continued)

(52) U.S. Cl.
CPC .......... *H01L 29/0673* (2013.01); *B82Y 10/00* (2013.01); *H01L 21/0245* (2013.01);
(Continued)

(58) Field of Classification Search
CPC .......... H01L 29/66666; H01L 29/4232; H01L 21/31; H01L 21/02293; H01L 21/324;
(Continued)

(56) References Cited

U.S. PATENT DOCUMENTS 6,855,583 B1  2/2005 Krivokapic et al.
7,326,608 B2 * 2/2008 Lee .................. H01L 29/66795
                                                    257/E21.014
(Continued)

FOREIGN PATENT DOCUMENTS

WO   WO2013095647 A1   6/2013
WO   WO2013095650 A1   6/2013

OTHER PUBLICATIONS

Peng, J.W., et al., "Germanium Nanowire Metal-Oxide-Semiconductor Field-Effect Transistor Fabricated by Complementary-Metal-Oxide-Semiconductor-Compatible Process", IEEE Transactions on Electron Devices, Jan. 2011, vol. 58, No. 1, pp. 74-79.

(Continued)

*Primary Examiner* — Mohammad M Hoque
(74) *Attorney, Agent, or Firm* — Scully, Scott, Murphy & Presser, P.C.; L. Jeffrey Kelly, Esq.

(57) ABSTRACT

A material stack comprising alternating layers of a silicon etch stop material and a germanium nanowire template material is formed on a surface of a bulk substrate. The material stack and a portion of the bulk substrate are then patterned by etching to provide an intermediate fin structure including a base semiconductor portion and alternating portions of the silicon etch stop material and the germanium nanowire template material. After recessing each germanium nanowire template material and optionally the base semiconductor portion, and etching each silicon etch stop material to define a new fin structure, a spacer is formed on sidewall surfaces of the remaining portions of the new fin structure. The alternating layers of germanium nanowire template material are then suspended above a notched surface portion of the bulk substrate and thereafter a functional gate structure is formed.

10 Claims, 8 Drawing Sheets

(51) Int. Cl.
| | |
|---|---|
| *H01L 29/66* | (2006.01) |
| *H01L 21/31* | (2006.01) |
| *H01L 21/311* | (2006.01) |
| *H01L 21/283* | (2006.01) |
| *H01L 21/3213* | (2006.01) |
| *H01L 21/324* | (2006.01) |
| *H01L 21/02* | (2006.01) |
| *H01L 29/78* | (2006.01) |
| *H01L 29/423* | (2006.01) |
| *H01L 21/308* | (2006.01) |
| *B82Y 10/00* | (2011.01) |
| *H01L 29/775* | (2006.01) |
| *H01L 21/306* | (2006.01) |
| *H01L 29/16* | (2006.01) |
| *H01L 21/3065* | (2006.01) |

(52) U.S. Cl.
CPC .... *H01L 21/0262* (2013.01); *H01L 21/02208* (2013.01); *H01L 21/02293* (2013.01); *H01L 21/02381* (2013.01); *H01L 21/02505* (2013.01); *H01L 21/02532* (2013.01); *H01L 21/02631* (2013.01); *H01L 21/02636* (2013.01); *H01L 21/283* (2013.01); *H01L 21/3081* (2013.01); *H01L 21/3086* (2013.01); *H01L 21/31* (2013.01); *H01L 21/31111* (2013.01); *H01L 21/31116* (2013.01); *H01L 21/324* (2013.01); *H01L 21/3247* (2013.01); *H01L 21/32133* (2013.01); *H01L 29/0676* (2013.01); *H01L 29/4232* (2013.01); *H01L 29/42392* (2013.01); *H01L 29/66439* (2013.01); *H01L 29/66666* (2013.01); *H01L 29/66795* (2013.01); *H01L 29/775* (2013.01); *H01L 29/785* (2013.01); *H01L 29/7827* (2013.01); *H01L 21/3065* (2013.01); *H01L 21/30604* (2013.01); *H01L 21/30608* (2013.01); *H01L 29/16* (2013.01)

(58) Field of Classification Search
CPC ............. H01L 21/32133; H01L 21/283; H01L 21/31111; H01L 21/02532; H01L 21/3065; H01L 21/30608; H01L 21/30604; H01L 29/16; H01L 29/0673; H01L 29/775; H01L 29/66439; H01L 29/42392; H01L 29/785; H01L 29/66795; H01L 21/3086; H01L 21/31116; H01L 21/3081; H01L 21/02631; H01L 21/02505; H01L 21/0245; H01L 21/0262; H01L 21/3247; B82Y 10/00
USPC ......................................................... 257/347
See application file for complete search history.

(56) References Cited

U.S. PATENT DOCUMENTS

| | | | |
|---|---|---|---|
| 7,727,830 B2 | 6/2010 | Jin et al. | |
| 8,110,458 B2 | 2/2012 | Jin et al. | |
| 8,183,104 B2 | 5/2012 | Hobbs et al. | |
| 8,273,591 B2 | 9/2012 | Hovel et al. | |
| 8,410,496 B2 | 4/2013 | Hersee et al. | |
| 8,445,892 B2 | 5/2013 | Cohen et al. | |
| 8,513,125 B2 | 8/2013 | Saracco et al. | |
| 8,558,279 B2 | 10/2013 | Cea et al. | |
| 8,853,019 B1 | 10/2014 | Fronheiser et al. | |
| 8,969,148 B2 | 3/2015 | Vinet et al. | |
| 9,024,364 B2 | 5/2015 | Okano | |
| 2005/0227435 A1 | 10/2005 | Oh et al. | |
| 2005/0233525 A1 | 10/2005 | Yeo et al. | |
| 2006/0231907 A1* | 10/2006 | Kim | H01L 29/42384 257/401 |
| 2007/0004124 A1* | 1/2007 | Suk | H01L 29/0673 438/238 |
| 2008/0135949 A1 | 6/2008 | Lo et al. | |
| 2009/0200539 A1 | 8/2009 | Qi | |
| 2010/0187503 A1 | 7/2010 | Moriyama et al. | |
| 2010/0276761 A1* | 11/2010 | Tung | H01L 29/41791 257/384 |
| 2011/0169012 A1* | 7/2011 | Hersee | B82Y 10/00 257/76 |
| 2012/0007051 A1 | 1/2012 | Bangsaruntip et al. | |
| 2012/0007052 A1* | 1/2012 | Hobbs | B82Y 10/00 257/24 |
| 2012/0138886 A1 | 6/2012 | Kuhn et al. | |
| 2012/0223413 A1 | 9/2012 | Lindert | |
| 2013/0075701 A1* | 3/2013 | Huang | H01L 21/823828 257/29 |
| 2013/0234215 A1* | 9/2013 | Okano | H01L 29/42392 257/255 |
| 2013/0270512 A1* | 10/2013 | Radosavljevic | H01L 21/823821 257/9 |
| 2013/0313513 A1 | 11/2013 | Cappellani et al. | |
| 2014/0042386 A1 | 2/2014 | Cea et al. | |
| 2014/0084342 A1 | 3/2014 | Cappellani et al. | |
| 2014/0091279 A1 | 4/2014 | Kachian et al. | |
| 2014/0151705 A1 | 6/2014 | Xiao et al. | |
| 2014/0151756 A1 | 6/2014 | Chang et al. | |
| 2014/0197377 A1 | 7/2014 | Kim et al. | |
| 2014/0273423 A1* | 9/2014 | Fronheiser | H01L 29/42392 438/585 |
| 2014/0285980 A1 | 9/2014 | Cappellani et al. | |
| 2015/0236120 A1 | 8/2015 | Hashemi et al. | |
| 2016/0064221 A1* | 3/2016 | Colinge | H01L 29/1033 257/192 |
| 2016/0071945 A1* | 3/2016 | Wang | H01L 29/42392 257/347 |
| 2016/0181114 A1* | 6/2016 | Li | B82Y 10/00 438/150 |
| 2016/0204224 A1* | 7/2016 | Fukui | B82Y 10/00 438/198 |

OTHER PUBLICATIONS

List of IBM Patents or Patent Applications Treated as Related dated May 11, 2016, 2 pages.

* cited by examiner

METHOD OF FORMATION OF GERMANIUM NANOWIRES ON BULK SUBSTRATES

BACKGROUND

The present application relates to non-planar semiconductor devices and a method of forming the same. More particularly, the present application relates to non-planar semiconductor devices including stacked germanium nanowires located over a notched segment of a bulk substrate and a method of forming the same.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, gate-all-around semiconductor nanowire field effect transistors (FETs) is the next step in the evolution of complementary metal oxide semiconductor (CMOS) devices. Semiconductor nanowire field effect transistors (FETs) can achieve higher drive currents with increasingly smaller dimensions as compared to conventional planar FETs. In its basic form, a semiconductor nanowire FET includes a source, a drain and one or more nanowire channels between the source and the drain. A gate electrode, which wraps around the one or more nanowire channels, regulates electron flow through the nanowire channel between the source and drain.

Germanium is known to have a higher electron and hole mobility than silicon and can be considered as a suitable material for n-type MOSFETs and p-type MOSFETs. Formation of germanium nanowires have been proposed utilizing germanium-on-insulator (GeOI) substrates which are expensive, or by selective growth of germanium in trenches, or by sidewall passivation by polymers in reactive-ion etch systems. Despite these advances, there is a need for providing an alternative method of forming germanium nanowires in a stacked configuration utilizing a bulk substrate.

SUMMARY

A material stack comprising alternating layers of a silicon etch stop material and a germanium nanowire template material is formed on a surface of a bulk substrate. The material stack and a portion of the bulk substrate are then patterned by etching to provide an intermediate fin structure including a base semiconductor portion and alternating portions of the silicon etch stop material and the germanium nanowire template material. After recessing each germanium nanowire template material and optionally the base semiconductor portion, and etching each silicon etch stop material to define a new fin structure, a spacer is formed on sidewall surfaces of the remaining portions of the new fin structure. The alternating layers of germanium nanowire template material are then suspended above a notched surface portion of the bulk substrate and thereafter a functional gate structure is formed.

In one aspect of the present application, a method of forming a non-planar semiconductor device is provided. The method of the present application includes providing a fin structure on a surface of a bulk substrate and comprising, from bottom to top, a base semiconductor portion, a first silicon etch stop layer portion, a first semiconductor nanowire template portion of germanium, a second silicon etch stop layer portion and a second semiconductor nanowire template portion of germanium. Next, a dielectric spacer is formed on sidewall surfaces of the fin structure. After dielectric spacer formation, a portion of the fin structure is suspended by completely removing the base semiconductor portion, wherein the suspending comprises an etch in which at least one notched surface portion is formed in the bulk substrate. After the suspending step, the dielectric spacer is removed and thereafter the first and second silicon etch stop layers are removed to provide a vertical stack of germanium nanowires suspended directly above the at least one notched surface portion of the bulk substrate.

In another aspect of the present application, a non-planar semiconductor device is provided. The non-planar semiconductor device of the present application includes a bulk substrate comprising a semiconductor material and having at least one notched surface portion, and a vertical stack of germanium nanowires suspended directly above the at least one notched surface portion of the bulk substrate.

DETAILED DESCRIPTION

Figure 1:
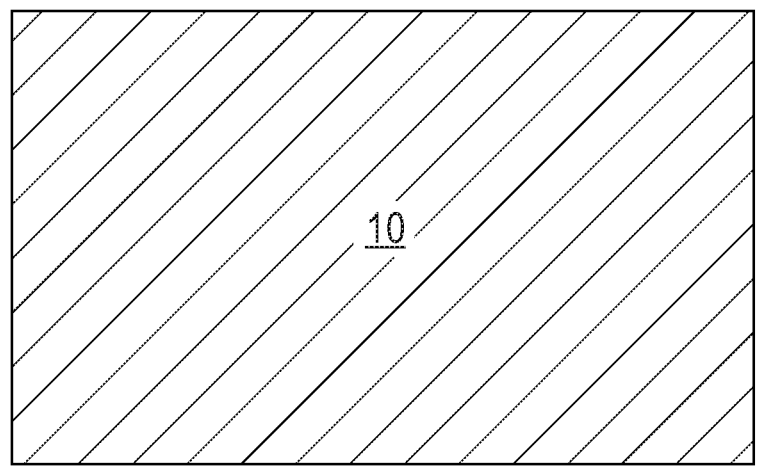
FIG. 1 is a cross sectional view of a first exemplary semiconductor structure comprising a bulk substrate in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements in the various embodiments of the present application are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

The present application provides a method of forming vertically stacked germanium nanowires on a bulk substrate using germanium recess and sidewall protection. By "bulk substrate" it is meant a substrate that is entirely composed of at least one semiconductor material. In some embodiments of the present application, the method of the present application can be scaled to a sub-20 nm nanowire pitch. Moreover, the method of the present application permits the formation of any number of vertically stacked germanium nanowires.

Referring first to FIG. 1, there is illustrated a first exemplary semiconductor structure comprising a bulk substrate 10 that can be employed in an embodiment of the present application. In one embodiment of the present application, the bulk substrate 10 can be comprised of a single semiconductor material including, but not limited to, Si, Ge, SiGe, SiC, SiGeC, and III/V compound semiconductors such as, for example, InAs, GaAs, and InP. In another embodiment, the bulk substrate 10 can be comprised of two or more of the aforementioned semiconductor materials. In one example, the bulk substrate 10 is comprised entirely of germanium. In another example, the bulk substrate 10 comprises a top semiconductor portion comprising germanium and a bottom semiconductor portion comprising Si.

In one embodiment, at least a topmost surface of the bulk substrate 10 can be comprised of a single crystalline semiconductor material, such as, for example, single crystalline silicon or single crystalline germanium. In other embodiments, at least the topmost surface of the bulk substrate 10 can be comprised of a polycrystalline or amorphous semiconductor material.

Figure 2:
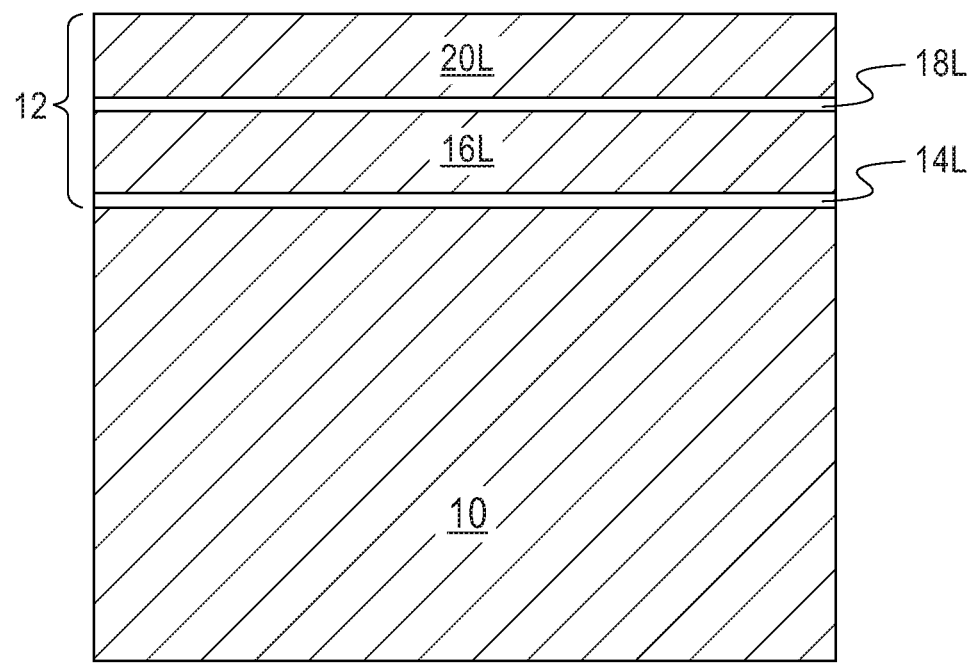
FIG. 2 is a cross sectional view of the first exemplary semiconductor structure of FIG. 1 after forming a material stack comprising, from bottom to top, a first silicon etch stop layer, a first semiconductor nanowire template layer of germanium, a second silicon etch stop layer and a second semiconductor nanowire template layer of germanium.

Referring now to FIG. 2, there is illustrated the first exemplary semiconductor structure of FIG. 1 after forming a material stack 12 on a topmost surface of the bulk substrate 10. The material stack 12 comprises alternating layers of a silicon etch stop layer and a semiconductor nanowire template layer of germanium. The number of silicon etch stop layers within the material stack 12 may be equal to or greater than 2, while the number of semiconductor nanowire template layers of germanium within the material stack 12 may be equal to or greater than 2. In accordance with the present application, the bottommost layer of material stack 12 includes a silicon etch stop layer, while the topmost layer of material stack 12 includes a semiconductor nanowire template layer of germanium. Each semiconductor nanowire template layer of germanium that is present in the material stack is further processed as described herein below to provide vertically stacked germanium nanowires. A portion of each of the vertically stacked germanium nanowires in which a gate dielectric material is formed thereon serves as the channel region (or body) of the non-planar semiconductor device of the present application.

In one embodiment and as shown in FIG. 2, the material stack 12 comprises, from bottom to top, a first silicon etch stop layer 14L, a first semiconductor nanowire template layer of germanium 16L, a second silicon etch stop layer 18L and a second semiconductor nanowire template layer of germanium 20L.

The material stack 12 including each silicon etch stop layer (e.g., 14L, 18L) and each semiconductor nanowire template layer of germanium (e.g., 16L, 20L) can be formed utilizing an epitaxial growth (or deposition) process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. Thus, in the present application, each material layer of the material stack 12 has an epitaxial relationship, i.e., same crystal orientation, with the underlying material layer of material stack 12. Moreover, the bottommost silicon etch stop layer (e.g., 14L) has an epitaxial relationship, i.e., same crystal orientation, with topmost surface of the bulk substrate 10. Thus, and when the topmost surface of the bulk substrate is comprised of a single crystalline semiconductor material, the entirety of the material stack 12 including each silicon etch stop layer (e.g., 14L, 18L) and each semiconductor nanowire template layer of germanium (e.g., 16L, 20L) is comprised of a single crystalline semiconductor material.

In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation.

Examples of various epitaxial growth process apparatuses that are suitable for use in forming each of material layer (e.g., 14L, 16L, 18L and 20L) of the material stack 12 of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process of the various material layers of the material stack 12 typically ranges from 550° C. to 900° C. Although higher temperature typically results in faster deposition, the faster deposition may result in crystal defects and film cracking.

The source gas for the epitaxial deposition of each silicon etch stop layer (e.g., 14L, 18L) within the material stack 12 includes a silicon containing gas source which includes, but is not limited to, silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. The source gas for the epitaxial deposition of each semiconductor nanowire template layer of germanium (e.g., 16L, 20L) within the material stack 12 includes, but is not limited to, germane, digermane, halogermane, dichlorogermane, trichlorogermane, tetrachlorogermane and combinations thereof. Carrier gases like hydrogen, nitrogen, helium and argon can be used during the various depositions of the layers that provide material stack 12.

In some embodiments, a vacuum may be broken between the epitaxial growth of each layer of different semiconductor material within the material stack 12. In other embodiments, a vacuum may be maintained between the epitaxial growth of each layer of different semiconductor material within the material stack 12.

In the present application, a thickness of each silicon etch stop layer (e.g., 14L, 18L) within the material stack 12 is less than a thickness of each semiconductor nanowire template layer of germanium (e.g., 16L, 20L) within the material stack 12. In one embodiment, the thickness of each silicon etch stop layer (e.g., 14L, 18L) of the material stack 12 may range from 1 nm to 4 nm, while the thickness of each semiconductor nanowire template layer of germanium (e.g., 16L, 20L) within the material stack 12 may range from 3 nm to 30 nm. Other thicknesses for each silicon etch stop layer (e.g., 14L, 18L) within the material stack 12 and each semiconductor nanowire template layer of germanium (e.g., 16L, 20L) within the material stack 12 that are lesser than or greater than the aforementioned thickness ranges may be employed in the present application.

As is shown in FIG. 2, each material layer (e.g., each silicon etch stop layer (14L, 18L) and each semiconductor nanowire template layer of germanium (16L, 20L)) that provides the material stack 12 is a contiguous layer that spans the entirety of the uppermost surface of the bulk substrate 10.

Figure 3:
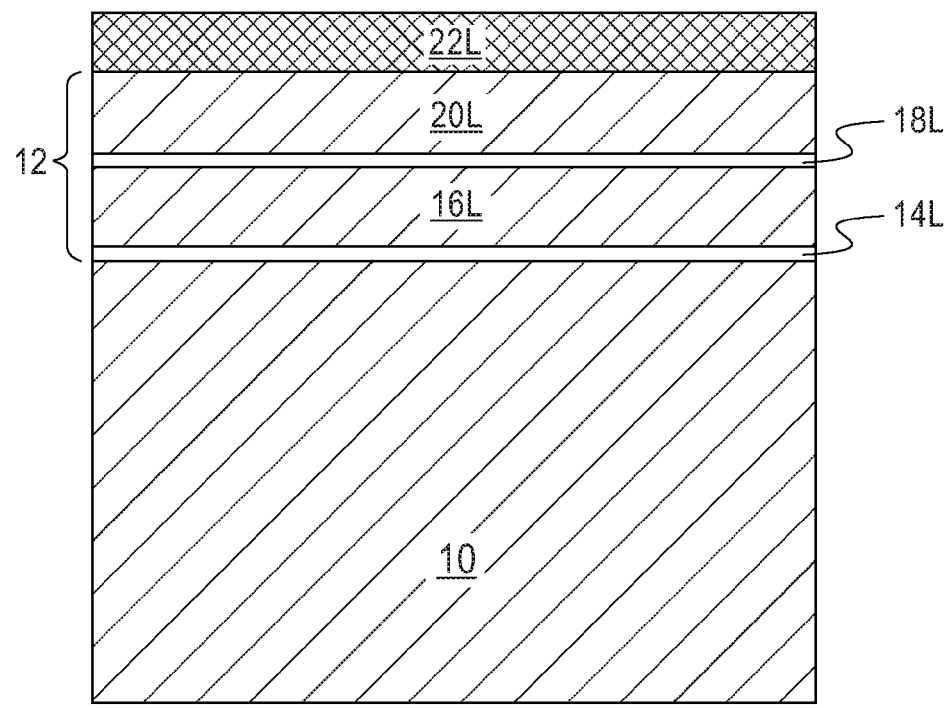
FIG. 3 is a cross sectional view of the first exemplary semiconductor structure of FIG. 2 after forming a hard mask layer on an exposed topmost surface of the material stack.

Referring now to FIG. 3, there is illustrated the first exemplary semiconductor structure of FIG. 2 after forming a hard mask layer 22L on an exposed topmost surface of material stack 12. The hard mask layer 22L is a contiguous layer (e.g., formed without any breaks or gaps) spanning the entire length of the exposed topmost surface of material stack 12. In one embodiment, and as illustrated in FIG. 3, the hard mask layer 22L is formed on an exposed topmost surface of the second semiconductor nanowire template layer of germanium 20L.

The hard mask layer 22L can be formed by providing a hard mask material on the exposed topmost surface of the material stack 12. The hard mask material that can be used in providing the hard mask layer 22L may include a semiconductor oxide, a semiconductor nitride and/or a semiconductor oxynitride. In one embodiment, the hard mask material that can be used in providing the hard mask layer 22L can be comprised of silicon dioxide. In another embodiment, the hard mask material that can be used in providing the hard mask layer 22L can be comprised of silicon nitride. In yet another embodiment, the hard mask material that can be used in providing the hard mask layer 22L can be a stack comprised of, in any order, silicon dioxide and silicon nitride.

In some embodiments, the hard mask material that can be used in providing the hard mask layer 22L can be formed by a deposition process such as, for example, chemical vapor deposition (CVD) and plasma enhanced chemical vapor deposition (PECVD). In other embodiments, the hard mask material that can be used in providing the hard mask layer 22L can be formed by a thermal process such as, for example, thermal oxidation and/or thermal nitridation. In yet other embodiments, the hard mask material that can be used in providing the hard mask layer 22L can be formed by a combination of a deposition process and a thermal process. The thickness of the hard mask material that can be used in providing the hard mask layer 22L can range from 2 nm to 10 nm, with a thickness from 3 nm to 6 nm being more typical.

Figure 4:
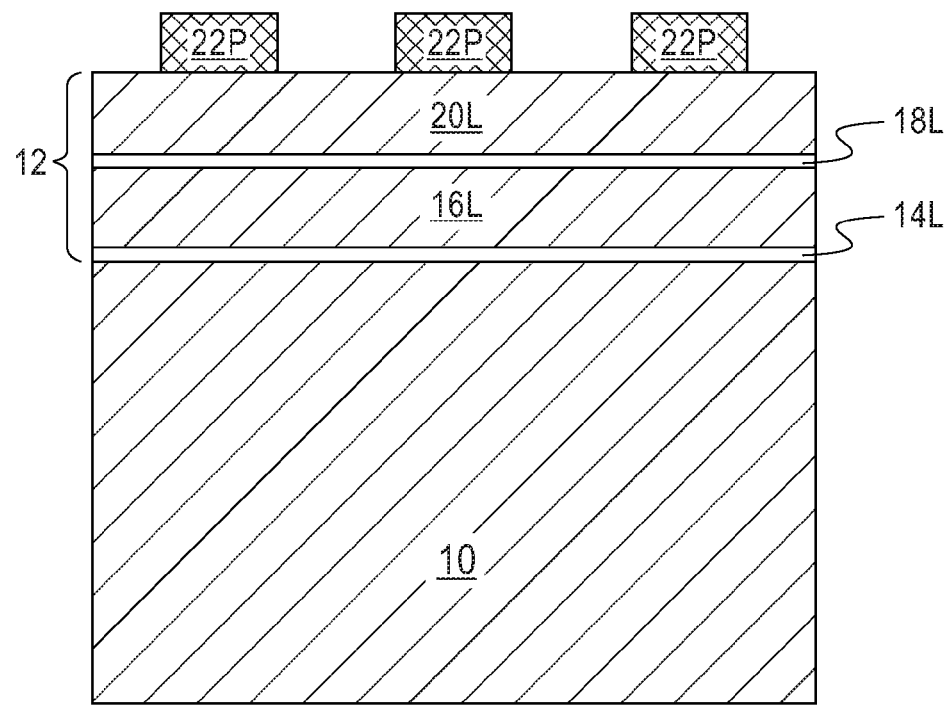
FIG. 4 is a cross sectional view of the first exemplary semiconductor structure of FIG. 3 after patterning the hard mask layer to provide a plurality of hard mask material portions on the topmost surface of the material stack.

Referring now to FIG. 4, there is illustrated the first exemplary semiconductor structure of FIG. 3 after patterning the hard mask layer 22L to provide a plurality of hard mask material portions 22P on the topmost surface of the material stack 12. Although a plurality of hard mask material portions 22P are described and illustrated, the present application works equally well when only a single hard mask material portion is formed. The hard mask material portions 22P are portions of the hard mask layer 22L that remain on the topmost surface of the material stack 10 after patterning. The patterning of the hard mask layer 22L can be performed by lithography and etching. Lithography includes forming a photoresist (not shown) on the topmost surface of hard mask layer 22L, exposing the photoresist to a desired pattern of radiation, and then developing the exposed photoresist with a conventional resist developer to provide a patterned photoresist atop the semiconductor substrate. An etch is then employed which transfers the pattern from the patterned photoresist into the hard mask layer 22L. In one embodiment, the etch used for pattern transfer may include a dry etch process such as, for example, reactive ion etching, plasma etching, ion beam etching or laser ablation. After transferring the pattern to the hard mask layer 22L, the patterned photoresist can be removed utilizing a conventional resist stripping process such as, for example, ashing. Such an embodiment is depicted in FIG. 4. In some embodiments (not shown), the patterned photoresist may remain atop the hard mask material portions 22P and be present during the patterning of the material stack 12 and a portion of bulk substrate 10. Following that patterning process, the patterned photoresist can then be removed by utilizing a conventional resist stripping process as mentioned above.

Figure 5:
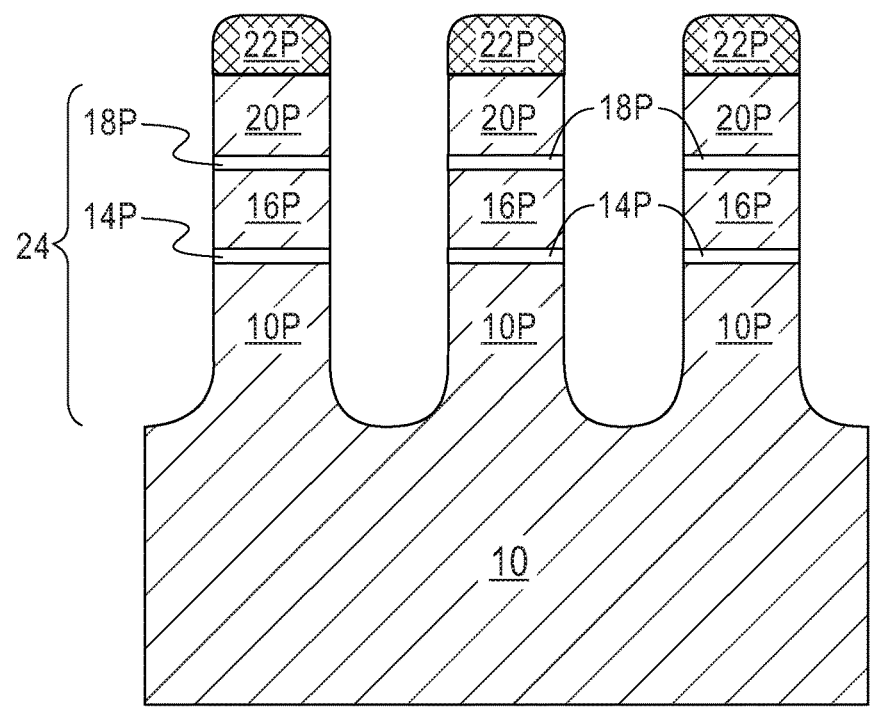
FIG. 5 is a cross sectional view of the first exemplary semiconductor structure of FIG. 4 after formation of a plurality of intermediate fin structures including, from bottom to top, a base semiconductor portion, a first silicon etch stop layer portion, a first semiconductor nanowire template portion of germanium, a second silicon etch stop layer portion, and a second semiconductor nanowire template portion of germanium.

Referring now to FIG. 5, there is illustrated the first exemplary semiconductor structure of FIG. 4 after formation of a plurality of intermediate fin structures 24 which includes a remaining portion of the bulk substrate 10 and remaining portions of the material stack 12. In the embodiment illustrated in the present application, each intermediate fin structure 24 includes, from bottom to top, a base semiconductor portion 10P, a first silicon etch stop layer portion 14P, a first semiconductor nanowire template portion of germanium 16P, a second silicon etch stop layer portion 18P, and a second semiconductor nanowire template portion of germanium 20P. As is shown, each intermediate fin structure 24 is capped with a hard mask layer portion 22P.

Each intermediate fin structure 24 that is provided is formed by transferring the previously provided pattern into the material stack 12 and a portion of bulk substrate 10 by anisotropic etching utilizing at least each hard mask material portion 22P as etch masks. In one embodiment of the present application, the patterning of the material stack 12 and a portion of bulk substrate 10 can be performed by an anisotropic etch that includes HCl/HBr chemistry.

Within each intermediate fin structure 24, each silicon etch stop layer portion (e.g., 14P, 18P) has a sidewall surface, i.e., vertical edge, which is vertically coincident to a sidewall surface of at least each semiconductor nanowire template portion of germanium (e.g., 16P, 20P). The term "vertically coincident" as used in the present application denotes that a sidewall surface of one material does not extend beyond or undercut a sidewall surface.

Figure 6:
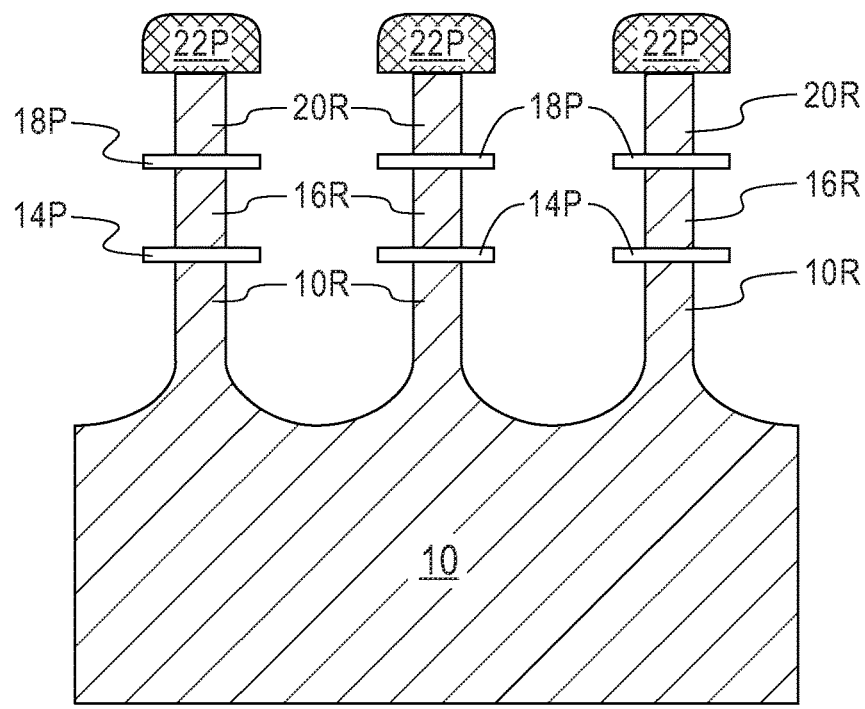
FIG. 6 is a cross sectional view of the first exemplary semiconductor structure of FIG. 5 after recessing the first semiconductor nanowire template portion of germanium, and the second semiconductor nanowire template portion of germanium of each intermediate fin structure.

Referring now to FIG. 6, there is illustrated the first exemplary semiconductor structure of FIG. 5 after recessing each semiconductor nanowire temperature portion of germanium (e.g., 16P, 20P) that is present in each intermediate fin structure 24. In some embodiments of the present application and when at least the topmost portion of the bulk substrate 10 is comprised of germanium, the base semiconductor portion 10P can also be recessed during this step of the present application. Such an embodiment is illustrated in FIG. 6

Notably, FIG. 6 shows an embodiment of the present application in which the base semiconductor portion 10P, the first semiconductor nanowire template portion of germanium 16P, and the second semiconductor nanowire template portion of germanium 20P of each intermediate fin structure 24 are all recessed. The remaining portion of each base semiconductor portion 10P can be referred to herein as a recessed base portion 10R, the remaining portion of each first semiconductor nanowire template portion of germanium 16P can be referred to herein as a first recessed semiconductor nanowire template portion of germanium 16R, and the remaining second semiconductor nanowire template portion of germanium 20P can be referred to herein as a second recessed semiconductor nanowire template portion of germanium 20R.

In accordance with the present application, each recessed semiconductor nanowire template portion of germanium (e.g., 16R, 20R) has sidewall surfaces that are vertically coincident to each other. The sidewall surfaces of each recessed semiconductor nanowire template portion of germanium (e.g., 16R, 20R) are however not vertically coincident to a sidewall surface of each silicon etch stop layer portion (e.g., 14P, 18P). Instead, and as shown, each recessed semiconductor nanowire template portion of germanium (e.g., 16R, 20R) has sidewall surfaces that are vertically offset and located inward from the sidewall surfaces of each silicon etch stop layer portion (e.g., 14P, 18P). Thus, the width of each silicon etch stop layer portion (e.g., 14P, 18P) is greater than a width of each recessed semiconductor nanowire template portion of germanium (e.g., 16R, 20R). In the illustrated embodiment, each recessed semiconductor base portion 10R has a sidewall surface that is vertically offset and located inward from a sidewall surface of each silicon etch stop layer portion (e.g., 14P, 18P). Thus, the width of each silicon etch stop layer portion (e.g., 14P, 18P) is greater than a width of each recessed semiconductor base portion 10R.

The recessing step described above can be performed utilizing an isotropic etching process that is selective for removing germanium as compared to silicon. In one example, the isotropic etch used to provide the structure shown in FIG. 6 of the present application may include a wet etch process in which a mixture of hydrogen peroxide and water is employed. In another example, the isotropic etch used to provide the structure shown in FIG. 6 of the present application may include a reactive ion etch.

Figure 7:
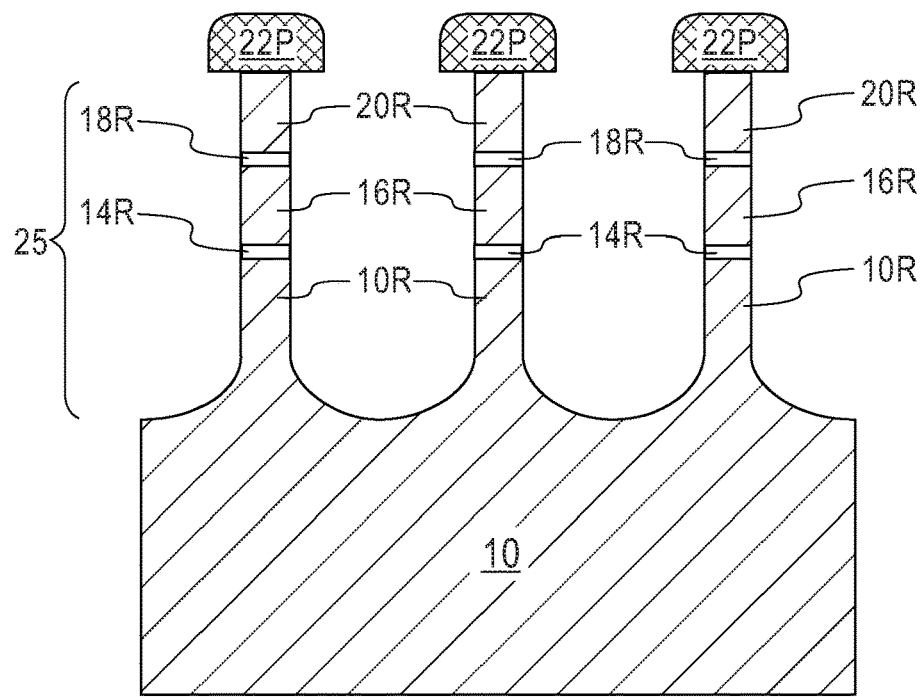
FIG. 7 is a cross sectional view of the first exemplary semiconductor structure of FIG. 6 after etching protruding portions of the first silicon etch stop layer portion and the second silicon etch stop layer portion of each intermediate fin structure to provide a fin structure.

Referring now to FIG. 7, there is illustrated the first exemplary semiconductor structure of FIG. 6 after etching protruding portions of each silicon etch stop layer portion (e.g., 14P, 18P). Each silicon etch stop portion that remains after this etch may be referred to herein as a remaining silicon etch stop portion 14R, 18R. As is shown in FIG. 7 and after this etch step, each remaining silicon etch stop portion (e.g., 14R, 18R) has a sidewall surface that is vertically coincident to a sidewall surface of each recessed semiconductor nanowire template portion of germanium (e.g., 16R, 20R). Layers 10R, 14R, 16R, 18R and 20R that are illustrated in FIG. 7 constituent a fin structure 25 that can be used in the present application for forming vertically stacked germanium nanowires. As explained above, the fin structure 25 shown in FIG. 7 is formed by first providing the intermediate fin structure shown in FIG. 5 and then subjecting the intermediate fin structure 24 to recessing and etching as mentioned above in FIGS. 6 and 7 of the present application. The fin structure 25 shown in FIG. 7 differs from the intermediate fin structure 24 shown in FIG. 5 in that each material layer of the fin structure 25 shown in FIG. 7 has a width that is less than the width of the same material layer of the intermediate fin structure 24.

The etching of the protruding portions of each silicon etch stop layer portion (e.g., 14P, 18P) comprises an isotropic etch that is selective to silicon. In one example, tetramethylammonium hydroxide (i.e., TMAH or TMAOH) can be used to provide the structure shown in FIG. 7; TMAH is a quaternary ammonium salt having a molecular formula $N(CH_3)_4^+OH^-$. In another example, an isotropic RIE can be used to provide the structure shown in FIG. 7.

Although the recessing of each semiconductor nanowire template portion of germanium (16P, 20P) and the etching of each protruding portion of each silicon etch stop layer portion (e.g., 14P, 18P) is described and illustrated as taking place utilizing two different steps, it is possible to combine these two steps into one single processing step.

Figure 8:
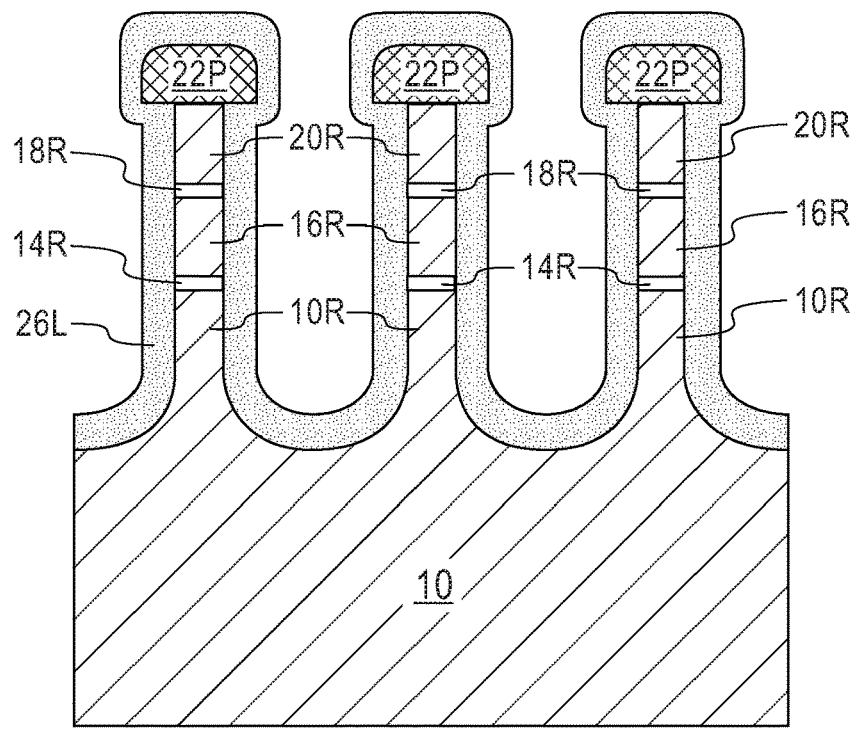
FIG. 8 is a cross sectional view of the first exemplary semiconductor structure of FIG. 7 after forming a dielectric spacer material on the fin structure.

Referring now to FIG. 8, there is illustrated the first exemplary semiconductor structure of FIG. 7 after forming a dielectric spacer material 26L. The dielectric spacer material 26L is provided as a conformal layer having substantially a same thickness variation throughout the entire length of the layer. The dielectric spacer material 26L is formed on exposed surfaces of the bulk substrate 10, exposed sidewall surfaces of each recessed base position 10R, exposed sidewall surfaces of each remaining silicon etch stop layer portion (e.g., 14R, 18R), sidewall surfaces of each recessed semiconductor nanowire template portion of germanium (e.g., 16R, 20R), and sidewall surfaces and a topmost surface of each hard mask layer portion 22P.

The dielectric spacer material 26L that can be employed in the present application includes, for example, a dielectric oxide (e.g., silicon dioxide) and/or a dielectric nitride (e.g., silicon nitride). The dielectric spacer material 26L can be formed utilizing a deposition process including, but not limited to, chemical vapor deposition, plasma enhanced chemical vapor deposition and atomic layer deposition. The thickness of the dielectric spacer material 26L may be from 2 nm to 10 nm, although other thicknesses that are lesser than or greater than the aforementioned thickness range may be employed in the present application.

Figure 9:
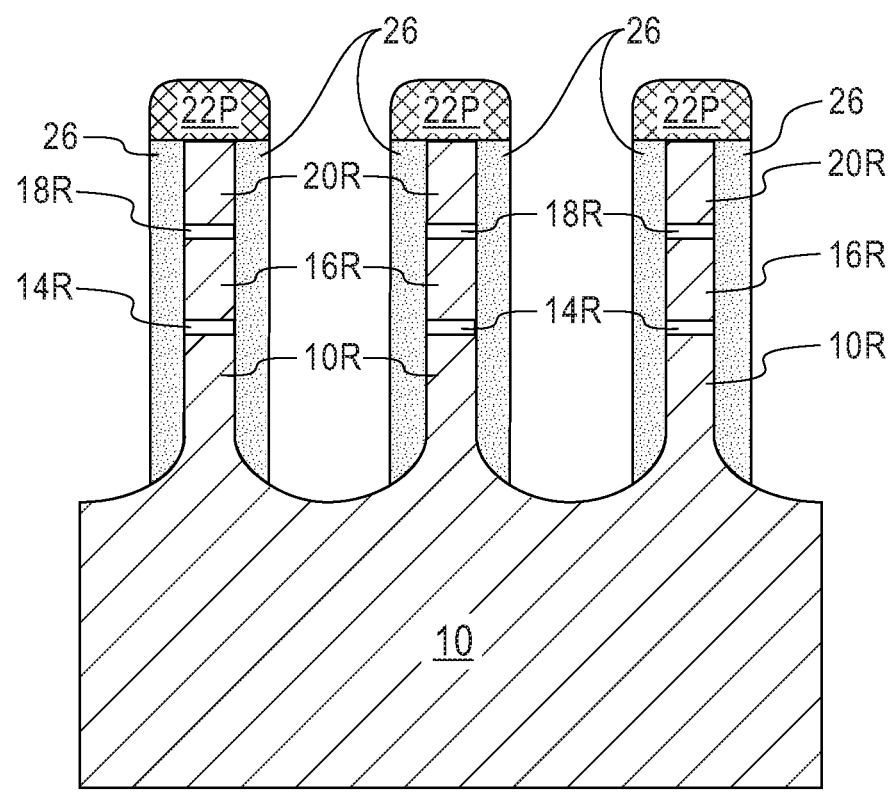
FIG. 9 is a cross sectional view of the first exemplary semiconductor structure of FIG. 8 after etching of the dielectric spacer material to provide a dielectric spacer on each fin structure.

Referring now to FIG. 9, there is illustrated the first exemplary semiconductor structure of FIG. 8 after etching of the dielectric spacer material 26L to provide a dielectric spacer 26 on each fin structure (e.g., 10R, 14R, 16R, 18R and 20R). The dielectric spacer 26 protects sidewall surfaces of each recessed base position 10R, each remaining silicon etch stop layer portion (e.g., 14R, 18R), and each recessed semiconductor nanowire template portion of germanium (e.g., 16R, 20R) of each fin structure (e.g., 10R, 14R, 16R, 18R and 20R).

The dielectric spacer 26 can be formed by subjecting the dielectric spacer material 26L to an anisotropic etching process such as, for example, RIE. Each dielectric spacer 26 that is provided has a topmost that is in direct physical contact with a bottommost surface of a hard mask layer portion 22P, and a bottommost surface that is in contact with a portion of the bulk substrate 10. Each dielectric spacer 26 has a width, as measured from one sidewall surface to an opposing sidewall surface, of from 2 nm to 10 nm.

Figure 10:
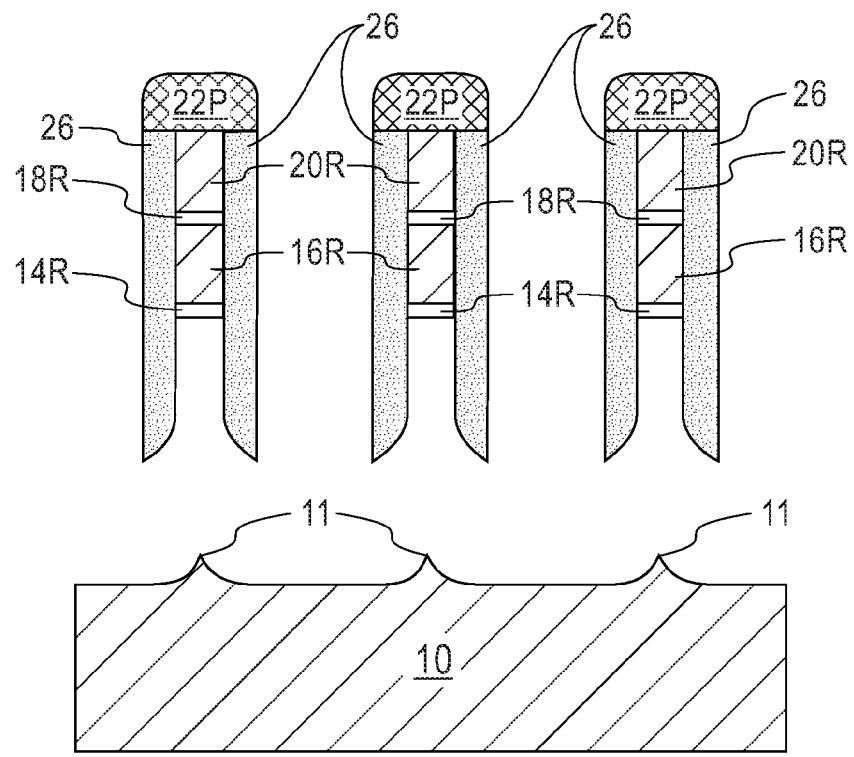
FIG. 10 is a cross sectional view of the first exemplary semiconductor structure of FIG. 9 after creating a notched surface portion within the bulk substrate by removing the semiconductor base portion.

Referring now to FIG. 10, there is illustrated the first exemplary semiconductor structure of FIG. 9 after creating a notched surface portion 11 within the bulk substrate 10 by removing each remaining semiconductor base portion 10R of the fin structure 25. The removal of each remaining semiconductor portion 10R comprises an etch that selectively removes the semiconductor material of the remaining semiconductor portion 10R. In one embodiment of the present application, and when the remaining semiconductor portion 10R comprises germanium, an etch utilizing a mixture of hydrogen peroxide and water can be used to remove the remaining semiconductor portion 10R and to create a notched surface portion 11 within bulk substrate 10. By "notched surface portion" it is meant a protruding surface portion of the bulk substrate 10 that extends upward from an otherwise planar surface.

As is shown, each notched surface portion 11 of the bulk substrate 10 is located directly beneath each remaining silicon etch stop layer portion (e.g. 14R, 18R) and each recessed semiconductor nanowire template portion of germanium (e.g., 16R, 20R).

Figure 11:
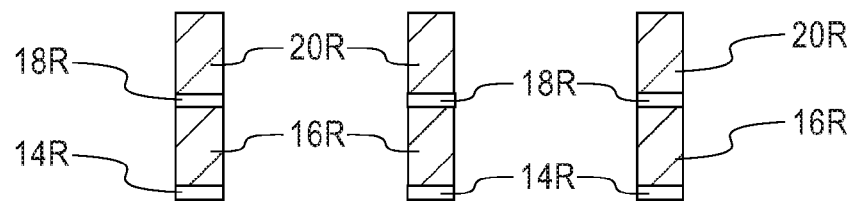
FIG. 11 is a cross sectional view of the first exemplary semiconductor structure of FIG. 10 after removing the hard mask layer portions and the dielectric spacer.
Figure 11:
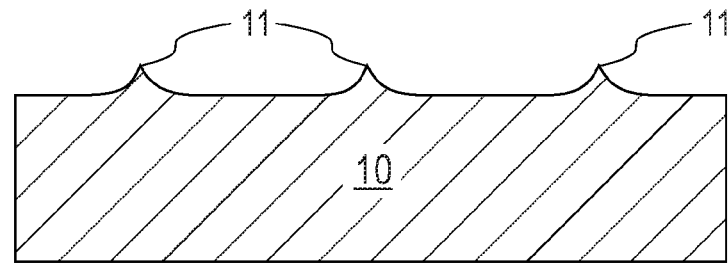

Referring now to FIG. 11, there is illustrated the first exemplary semiconductor structure of FIG. 10 after removing each hard mask layer portion 22P and each dielectric spacer 26. In one embodiment of the present application, the removal of each hard mask layer portion 22P and each dielectric spacer 26 can be performed simultaneously utilizing a single etch. In another embodiment of the present application, the removal of each hard mask layer portion 22P and each dielectric spacer 26 can be performed utilizing different etching steps and different etch chemistries. In one example, each hard mask layer portion 22P can be removed utilizing a mixture of HF and water and each dielectric spacer 26 can be removed utilizing a mixture of $H_3PO_4$ and water. The order of removing the hard mask layer portion 22P and the dielectric spacer 26 from the structure may vary and is not critical to the present application.

Figure 12:
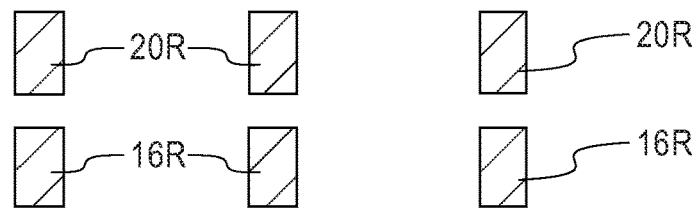
FIG. 12 is a cross sectional view of the first exemplary semiconductor structure of FIG. 11 after removing the remaining first silicon etch stop layer portion and the remaining second silicon etch stop layer portion to provide a plurality of vertically stacked and suspended germanium nanowires located directly above the notched surface portion of the base substrate.
Figure 12:
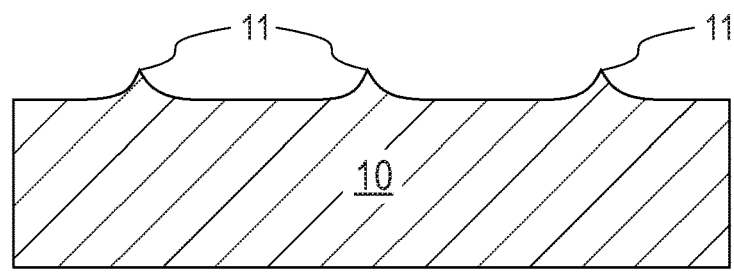

Referring now to FIG. 12, there is illustrated the first exemplary semiconductor structure of FIG. 11 after removing each remaining silicon etch stop layer portion (14R, 18R) to provide a plurality of vertically stacked and suspended germanium nanowires (16R, 20R) located directly above the notched surface portion 11 of bulk substrate 10. In the illustrated embodiment, the removal of each remaining silicon etch stop layer portion (e.g., 14R and 18R) provides a plurality of vertically stacked and suspended germanium nanowires that comprises, from bottom to top, a first semiconductor nanowire of germanium and a second semiconductor nanowire of germanium. The first semiconductor nanowire of germanium constitutes the recessed first semiconductor nanowire template portion of germanium 16R, while the second semiconductor nanowire of germanium constitutes the recessed second semiconductor nanowire template portion of germanium 20R. It is emphasized that the vertically stacked and suspended germanium nanowires are not free standing. Rather end portions of the vertically stacked and suspended germanium nanowires (which are located in and out of the plane of the drawing) are anchored to an anchoring element. The anchoring element consists of a non-processed portion of material stack 12.

The removal of each remaining silicon etch stop layer portion (e.g., 14R and 18R) is performed utilizing an etch that is selective to silicon as compared to germanium. In one example, TMAH can be used to remove each remaining silicon etch stop layer portion (e.g., 14R and 18R) and provide the structure illustrated in FIG. 12 of the present application.

In this embodiment of the present application, each germanium nanowire (e.g., 16R, 20R) that constitutes the plurality of vertically stacked and suspended germanium nanowires has a planar topmost surface, a planar bottommost surface and non-faceted sidewall surfaces connect the planar topmost to bottommost surface.

Figure 13:
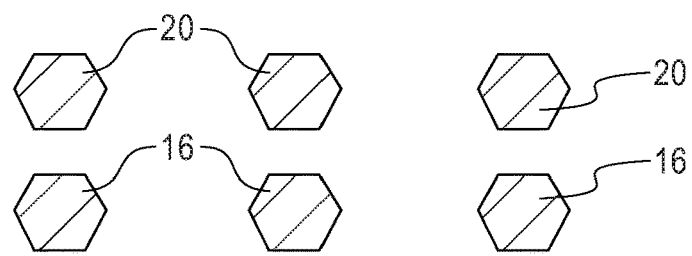
FIG. 13 is a cross sectional view of the first exemplary semiconductor structure of FIG. 12 after an optional bake process is performed.
Figure 13:
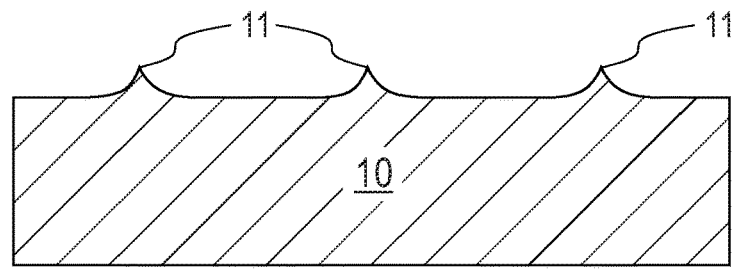

Referring now to FIG. 13, there is illustrated the first exemplary semiconductor structure of FIG. 12 after an optional bake process is performed. The optional bake process thins and shapes each semiconductor nanowire of germanium shown in FIG. 12 such that faceted sidewall surfaces are provided. The optional bake process comprises a hydrogen anneal. In one embodiment of the present application, the hydrogen anneal is performed at an anneal temperature from 500° C. to 700° C. The duration of the hydrogen anneal may vary. In one example, the duration of the hydrogen anneal can be from 30 seconds to 10 minutes.

In this embodiment of the present application, each semiconductor nanowire of germanium 16, 20 that constitutes the plurality of vertically stacked and suspended germanium nanowires has a planar topmost surface, a planar bottommost surface and faceted sidewall surfaces that connect the planar topmost surface to the planar bottommost surface as depicted in FIG. 13.

Figure 14A:
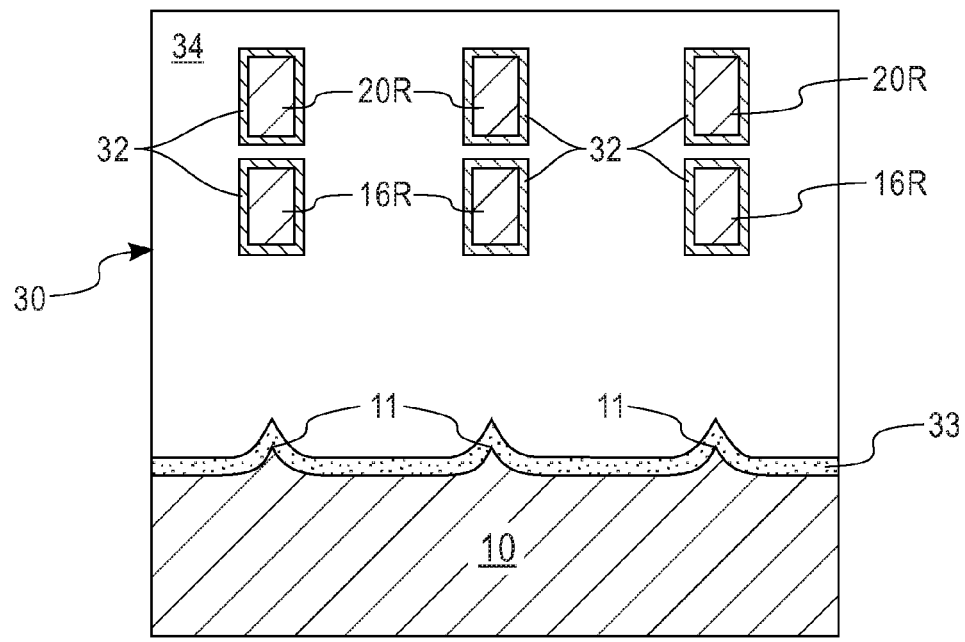
FIG. 14A and FIG. 14B are cross sectional views of the first exemplary semiconductor structures of FIGS. 12 and 13, respectively, after formation of a functional gate structure.
Figure 14B:
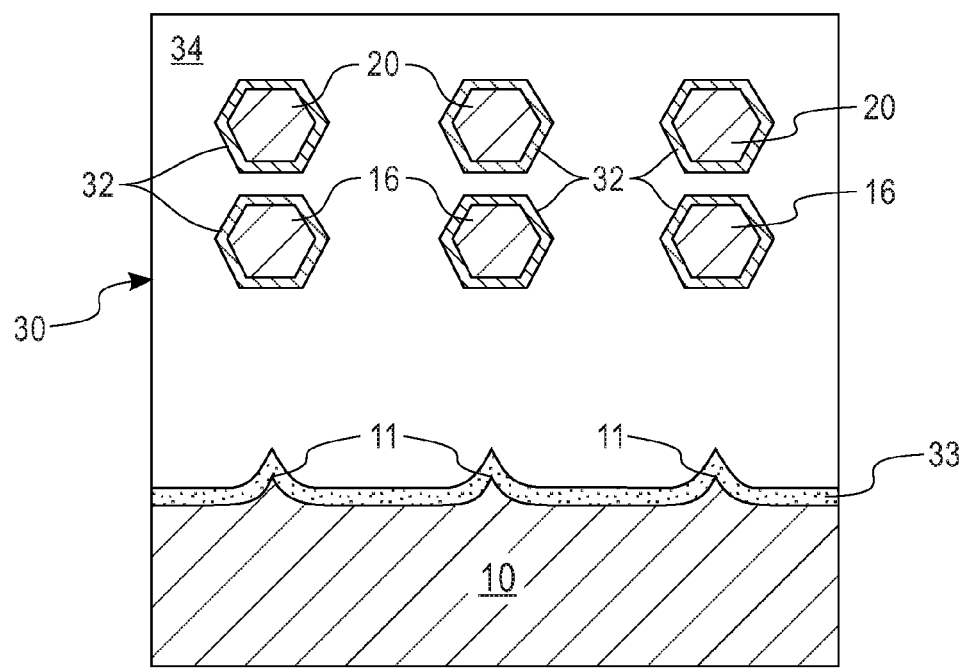

Referring now to FIG. 14A and FIG. 14B, there is illustrated the first exemplary semiconductor structures of FIGS. 12 and 13, respectively, after formation of a functional gate structure 30. The term "functional gate structure" is used throughout the present application as a permanent gate structure used to control output current (i.e., flow of carriers in the channel) of a semiconducting device through electrical or magnetic fields.

The function gate structure 30 includes a gate dielectric material portion 32 that wraps around each of the semiconductor nanowires of germanium (e.g., 16R, 20R as shown in FIG. 14A, or 16, 20 as shown in FIG. 14B). A portion of the gate dielectric material is also present on the exposed portions of the bulk substrate 10 including the notched surface portion 11. The portion of the gate dielectric material that is present on the surface of the bulk substrate 10 and the notched surface portion 11 is herein referred to herein as a substrate dielectric material layer 33. The functional gate structure 30 also includes a gate conductor material portion that is located on the exposed surfaces of each gate dielectric material portion 32 and the substrate dielectric material layer 33.

The gate dielectric material that provides the gate dielectric material portion 32 and the substrate dielectric material layer 33 can be an oxide, nitride, and/or oxynitride. In one example, the gate dielectric material that provides the gate dielectric material portion 32 and the substrate dielectric material layer 33 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed.

The gate dielectric material used in providing the gate dielectric material portion 32 and the substrate dielectric material layer 33 can be formed by any deposition technique including, for example, chemical vapor deposition (CVD), plasma enhanced chemical vapor deposition (PECVD), physical vapor deposition (PVD), sputtering, or atomic layer deposition. In some embodiments, a thermal process including, for example, thermal oxidation and/or thermal nitridation may be used in forming the gate dielectric material portion 32 and the substrate dielectric material layer 33. When a different gate dielectric material is used for the gate dielectric material portions and the substrate dielectric material layer, block mask technology can be used. In one embodiment of the present application, the gate dielectric material used in providing the gate dielectric material portion 32 and the substrate dielectric material layer 33 can have a thickness in a range from 1 nm to 10 nm. Other thicknesses that are lesser than or greater than the aforementioned thickness range can also be employed for the gate dielectric material.

The gate conductor material portion 34 of the functional gate structure 30 comprises a gate conductor material. The gate conductor material used in providing the gate conductor material portion 34 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, the gate conductor material portion 34 may comprise an nFET gate metal, while in yet other embodiments, the gate conductor material portion 34 may comprise a pFET gate metal.

The gate conductor material used in providing the gate conductor material portion 34 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. The gate conductor material may be patterned after formation thereof. When a different gate conductor material is used for the gate conductor portions, block mask technology can be used. In one embodiment, the gate conductor material used in providing the gate conductor material portion 34 has a thickness from 1 nm to 100 nm. Other thicknesses that are lesser than or greater than the aforementioned thickness range can also be employed for the gate conductor material.

In some embodiments of the present application, the gate structure is formed by first depositing a layer of gate dielectric material and a layer of gate conductor material, and then patterning the same by lithography and etching.

Following formation of the gate structure, a dielectric spacer (not shown) can be formed on sidewall surfaces of the gate structure 30. The dielectric spacer can be comprised of one of the dielectric spacer materials mentioned above and the dielectric spacer can be formed by deposition of the dielectric material and etching.

Source/drain regions (not shown) can be formed in portions of each of the semiconductor nanowires of germanium (e.g., 16R, 20R as shown in FIG. 14A, or 16, 20 as shown in FIG. 14B) that do not include the functional gate structure 30 and the dielectric spacer. The source/drain regions can be formed by introducing a dopant into the exposed portions of each semiconductor nanowires of germanium, which are not covered by the functional gate structure and the dielectric spacer. The dopant can be n-type or p-type. The term "p-type" refers to the addition of impurities to an intrinsic semiconductor that creates deficiencies of valence electrons. Examples of p-type dopants, i.e., impurities, include, but are not limited to, boron, aluminum, gallium and indium. "N-type" refers to the addition of impurities that contributes free electrons to an intrinsic semiconductor. Examples of n-type dopants, i.e., impurities, include, but are not limited to, antimony, arsenic and phosphorous. In some embodiments, the dopant can be introduced into the exposed portions of each semiconductor material, which are not covered by either the gate structure, by ion implantation or gas phase doping.

In some embodiments, the source/drain regions can be merged. The merging of the source/drain regions can be provided by growing an epitaxial semiconductor material utilizing an epitaxial growth process as defined above.

In some embodiments of the present application (not shown), at least one sacrificial gate structure is formed over a portion of each semiconductor nanowires of germanium prior to forming the functional gate structure 30. The term "sacrificial gate structure" is used throughout the present application to denote a material that serves as a placeholder structure for a functional gate structure to be subsequently formed. The term "functional gate structure" is used throughout the present application as a permanent gate structure used to control output current (i.e., flow of carriers in the channel) of a semiconducting device through electrical or magnetic fields.

In embodiments in which sacrificial gate structures are formed, the sacrificial gate structure can be formed by first providing a blanket layer of a sacrificial gate material. The blanket layer of sacrificial gate material can be formed, for example, by chemical vapor deposition or plasma enhanced chemical vapor deposition. The thickness of the blanket layer of sacrificial gate material can be from 50 nm to 300 nm, although lesser and greater thicknesses can also be employed. The blanket layer of sacrificial gate material can include any material that can be selectively removed from the structure during a subsequently performed etching process. In one embodiment, the blanket layer of sacrificial gate material may be composed of polysilicon. In another embodiment of the present application, the blanket layer of sacrificial gate material may be composed of a metal such as, for example, Al, W, or Cu. After providing the blanket layer of sacrificial gate material, the blanket layer of sacrificial gate material can be patterned by lithography and etching so as to form the sacrificial gate structure.

After forming the sacrificial gate structure, a dielectric spacer may be formed on sidewalls of the sacrificial gate structure. The dielectric spacer can contain any dielectric spacer material including, for example, a dielectric oxide (e.g., silicon dioxide) and/or a dielectric nitride (e.g., silicon nitride). The dielectric spacer can be formed by first depositing the dielectric spacer material and then subjected the deposited dielectric spacer material to an anisotropic etch. In some embodiments, and prior to forming the dielectric spacer, source/drain extension regions (not shown) can be formed into exposed portions of each semiconductor nanowire of germanium. After forming the dielectric spacer, source regions and drain regions (also not shown) can be formed into exposed portions of semiconductor nanowires of germanium not protected by the sacrificial gate structure and the dielectric spacer by ion implantation. Following source/drain formation, the sacrificial gate structure is removed and replaced with a functional gate structure as defined above.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed as new is:

1. A semiconductor structure comprising:
a bulk substrate comprising a semiconductor material and having at least one notched surface portion and at least one recessed portion adjacent to the at least one notched surface portion of the substrate, wherein said at least one recessed portion has an uppermost horizontal surface below an uppermost surface of said at least once notched surface portion, and wherein said at least one notched surface portion of said bulk substrate has a pointed topmost surface;
a vertical stack of horizontal nanowires suspended directly above said at least one notched surface portion of said bulk substrate, wherein each horizontal nanowire of said vertical stack of horizontal nanowires consists of germanium and is of unitary construction, and wherein each horizontal nanowire has a horizontal planar topmost surface, a horizontal planar bottommost surface and faceted vertical sidewall surfaces, and wherein the planar topmost surface and the planar bottommost surface of each horizontal nanowire are parallel to a horizontal surface of said bulk substrate; and
a contiguous dielectric material layer located directly on an entire horizontal surface of said bulk substrate.

2. The semiconductor structure of claim 1, further comprising a functional gate structure surrounding a portion of each horizontal nanowire of said vertical stack of horizontal nanowires.

3. The semiconductor structure of claim 2, wherein said functional gate structure comprises a gate dielectric material portion and a gate conductor material portion, wherein said gate dielectric material portion is located entirely around each of said horizontal nanowires of said vertical stack of horizontal nanowires.

4. The semiconductor structure of claim 3, wherein said contiguous dielectric material layer and said gate dielectric material portion comprise a same dielectric material.

5. The semiconductor structure of claim 4, wherein said contiguous dielectric material layer and said gate dielectric material portion are spaced apart from each other by a portion of said gate conductor material portion.

6. The semiconductor structure of claim 1, wherein said notched surface portion and said bulk substrate comprise germanium.

7. The semiconductor structure of claim 1, wherein each of said horizontal nanowires of said vertical stack of horizontal nanowires comprises a single crystalline germanium material.

8. The semiconductor structure of claim 1, wherein said bulk substrate comprises a top portion of germanium and a bottom portion of silicon, wherein said notched surface portion further comprises germanium.

9. The semiconductor structure of claim 1, wherein said bulk substrate and said notched surface portion comprise silicon.

10. The semiconductor structure of claim 1, wherein said at least one recessed portion of said bulk substrate adjacent said notched surface portion has a concave uppermost surface.

* * * * *